United States Patent
Shin et al.

(10) Patent No.: US 7,595,526 B2
(45) Date of Patent: Sep. 29, 2009

(54) CAPACITOR AND METHOD FOR FABRICATING THE SAME

(75) Inventors: Dong-Woo Shin, Ichon-shi (KR); Hyung-Bok Choi, Ichon-shi (KR)

(73) Assignee: Hynix Semiconductor Inc., Ichon-shi, Kyungki-do (KR)

( * ) Notice: Subject to any disclaimer, the term of this patent is extended or adjusted under 35 U.S.C. 154(b) by 202 days.

(21) Appl. No.: 11/201,306

(22) Filed: Aug. 11, 2005

(65) Prior Publication Data

US 2005/0269618 A1    Dec. 8, 2005

Related U.S. Application Data

(62) Division of application No. 10/316,898, filed on Dec. 12, 2002, now Pat. No. 6,946,356.

(30) Foreign Application Priority Data

Sep. 17, 2002    (KR) ............................... 2002-56445

(51) Int. Cl.
    *H01L 29/94* (2006.01)
(52) U.S. Cl. ............... 257/309; 257/306; 257/E27.016; 257/E27.017
(58) Field of Classification Search ......... 438/396–399, 438/255, 665, 964; 257/309, 68, 71, 306, 257/E27.009, E27.016–E27.017, E27.024–E27.025, 257/E27.048
    See application file for complete search history.

(56) References Cited

U.S. PATENT DOCUMENTS

| | | | |
|---|---|---|---|
| 5,811,344 A * | 9/1998 | Tu et al. | 438/396 |
| 5,827,766 A | 10/1998 | Lou | |
| 5,930,641 A * | 7/1999 | Pan | 438/398 |
| 6,159,785 A * | 12/2000 | Tsuchimoto et al. | 438/238 |
| 6,171,903 B1 * | 1/2001 | Chiou | 438/254 |
| 6,174,770 B1 * | 1/2001 | Chi | 438/255 |
| 6,194,281 B1 * | 2/2001 | Kang et al. | 438/398 |
| 6,348,377 B2 | 2/2002 | Dong et al. | |
| 6,368,913 B1 | 4/2002 | Yamamoto | |
| 6,399,439 B1 * | 6/2002 | Yamanishi et al. | 438/255 |
| 6,417,066 B1 * | 7/2002 | Lou | 438/396 |

(Continued)

FOREIGN PATENT DOCUMENTS

KR    2002-10830    2/2002

*Primary Examiner*—Douglas M Menz
*Assistant Examiner*—Matthew W Such
(74) *Attorney, Agent, or Firm*—Lowe Hauptman Ham & Berner, LLP

(57) ABSTRACT

A method for manufacturing a capacitor in a semiconductor device for securing capacitance without a merging phenomenon during a MPS grain growth process. The manufacturing step begins with a preparation of a substrate. The interlayer dielectric (ILD) layer is formed on the substrate and is etched to form conductive plug. Then, an etch barrier layer and a sacrifice insulating layer are formed on entire surface subsequently. A cylinder typed first electrode is formed over the conductive plug using the sacrifice insulating layer. Thereafter, first meta-stable poly silicon (MPS) grains are formed on inner wall of the first electrode except a bottom region thereof. However, second MPS grains with small sizes can be formed in the bottom region for increasing a storage area of the first electrode. Finally, a dielectric layer and a second electrode are formed on the first electrode subsequently.

3 Claims, 10 Drawing Sheets

U.S. PATENT DOCUMENTS

| | | |
|---|---|---|
| 6,426,527 B1 | 7/2002 | Higashino |
| 6,465,301 B1 * | 10/2002 | Cheong ..................... 438/255 |
| 2001/0006834 A1 * | 7/2001 | Hirota et al. ............... 438/244 |
| 2001/0030336 A1 * | 10/2001 | Yamamoto ................. 257/296 |
| 2001/0039090 A1 * | 11/2001 | Choi et al. ................. 438/255 |
| 2003/0215998 A1 * | 11/2003 | Coursey ..................... 438/255 |

* cited by examiner

CAPACITOR AND METHOD FOR FABRICATING THE SAME

CROSS REFERENCE TO RELATED APPLICATION

This application is a divisional of U.S. Ser. No. 10/316,898, filed on Dec. 12, 2002 now U.S. Pat. No. 6,946,356. This application, in its entirety, is incorporated herein by reference.

FIELD OF THE INVENTION

The present invention relates to a semiconductor device; and, more particularly, to a capacitor in the semiconductor device and a method for manufacturing the same, for preventing merging phenomenon of meta-stable poly silicon (MPS) grains having a good step coverage of a dielectric layer.

DESCRIPTION OF THE PRIOR ART

In recent years, several researches are advanced for securing a capacitance of about 25 fF to be required in a cell in spite of decreasing a minimum line width of a dynamic random access memory (DRAM) device and a high-density integrated circuit.

Generally, in order to secure the capacitance, there are two kinds of methods to be researched. One is to develop a dielectric material with a high dielectric constant and the other is to develop a structure of the cell capacitor. Therefore, there has been proposed the capacitor having a high dielectric material or a new structure for increasing a surface of a charge storage electrode, such as a concave type or a three-dimensional cylinder type.

As the first method to secure the capacitance of the capacitor, an oxide or a nitride of which the dielectric constant is about 3.8 and 7 respectively, was utilized for fabricating the capacitor in an early stage. Nowadays, tantalum oxide ($Ta_2O_5$), of which the dielectric constant ranges from 20 to 25, is widely used for the DRAM device having the feature size of 256 Mb and beyond.

As the second method to secure capacitance, a stack typed capacitor was used to fabricate the capacitor in the early stage. But, as a meta-stable poly silicon (MPS) technique is applied, a surface area of a bottom electrode can be increased in a range of about 1.7 times to 2 times. Therefore, the capacitance of the capacitor can be increased in spite of downsizing the device. In recent days, a concave or a cylinder typed capacitor having MPS grains therein are utilized for securing the capacitance.

However, in the cylinder typed capacitor in which the MPS grains are formed on inner walls and outer walls of electrodes, there is a drawback that a bridge between each neighboring cylinders is happened due to the MPS grains formed on outer walls of the electrodes, thereby causing an electrical-short phenomenon between each cylinder.

To solve the electrical connection between each neighboring cylinder, there is proposed a method to reduce sizes of the MPS grains formed on the outer walls of the electrodes by adjusting a doping concentration into the inner wall and the outer wall of silicon layer differently. But, since a critical dimension between neighboring cells is reduced sharply, it is impossible to apply the above method in practice. To overcome the above problem, a method to form the MPS grains on the inner walls of the electrodes in the concave or the cylinder typed capacitor.

Referring to FIGS. 1A to 1D, there are cross sectional views setting forth a method for manufacturing a conventional capacitor.

In FIG. 1A, the conventional manufacturing process begins with a preparation of a semiconductor substrate 11 provided with a conductive region 12 such as a source/drain region. Thereafter, an interlayer dielectric (ILD) layer 13 is formed on the semiconductor substrate 11. Then, the ILD layer 13 on the substrate 11 are patterned into a predetermined configuration to form a contact plugs 14. After an etch barrier layer 15 and a sacrifice insulating layer 16 are formed on the ILD layer 13 and the contact plugs 14 subsequently, the etch barrier layer 15 and the sacrifice insulating layer 16 are patterned into another predetermined configuration, thereby forming openings 17 over the contact plugs 14. At this time, since the height of the sacrifice insulating layer 16 should be high in order to increase the capacitance of the capacitor, the openings have a high aspect ratio. Thus, a bottom critical dimension (BCD) is smaller than a top critical dimension ($T_{CD}$).

Referring to FIG. 1B, a first conductive layer 18 is deposited on the sacrifice insulating layer 16 and the openings 17. Next, a photoresist layer 19 is formed on the first conductive layer 18 till the openings 17 are completely filled in. Here, the first conductive layer 18 is a double layer to form the MPS grains only on an inner wall of the first conductive layer 18. Thus, the inner wall of the first conductive layer 18 uses an undoped amorphous silicon layer and an outer part utilizes a doped amorphous silicon layer. Thereafter, a chemical-mechanical polishing (CMP) or an etch-back process is carried out till the top surface of the sacrifice insulating layer 16 is exposed, whereby a first electrode 18 is formed only within the openings 17.

In FIG. 1C, after the photoresist layer 19 is stripped off, the MPS grains 20 are formed on the inner wall of the first electrode 18 through the MPS grain growth process.

Referring to FIG. 1D, the sacrifice insulating layer 16 is removed using a dip-out process to expose the first electrode 18. Then, a dielectric layer 21 and a second electrode 22 are formed on the first electrode 18 in series.

As mentioned already, the conventional cylinder typed capacitor uses the double layer of the first electrode 18 provided with the doped and the undoped amorphous silicon layers in order to form the MPS grains 20 only on the inner wall of the cylinder.

However, the conventional cylinder typed capacitor has a shortcoming of the high aspect ratio, i.e., approximately 19 to 20. Therefore, a cell critical dimension may be deteriorated because the top critical dimension is larger than the bottom critical dimension. Additionally, there is happened a merging phenomenon between the MPS grains in a concave or a bottom region of the cylinder during the MPS grain growth process, as denoted '20A' in FIG. 1C. The merging phenomenon gives rise to a serious problem that a step coverage of the dielectric layer such as tantalum oxide becomes deteriorated. Furthermore, an electric field is concentrated during the operation of the device so that leakage current may be increased, thereby inducing the decrease of a breakdown voltage eventually. In addition, the merging phenomenon makes the surface of the bottom electrode, i.e., the first electrode 18, decrease so that the total capacitance is decreased at last.

SUMMARY OF THE INVENTION

It is, therefore, an object of the present invention to provide a method for manufacturing a capacitor in a semiconductor device for securing capacitance without a merging phenomenon during a MPS grain growth process.

It is another object of the present invention to provide a capacitor having MPS grains therein for securing capacitance without a merging phenomenon during a MPS grain growth process, wherein the MPS grains are formed on only sidewall of the capacitor.

It is further another object of the present invention to provide a capacitor having first and second MPS grains therein for securing capacitance without a merging phenomenon during a MPS grain growth process, wherein the second MPS grains formed in a bottom region are smaller than the first MPS grains.

In accordance with one aspect of the present invention, there is provided a method for manufacturing a capacitor, comprising the steps of: a) forming a sacrifice insulating layer on a semiconductor substrate; b) patterning the sacrifice insulating layer into a predetermined configuration to achieve openings; c) forming a first electrode on the sacrifice insulating layer and the openings; d) forming a grain growth preventing layer on the top face of the first electrode; e) patterning the grain growth preventing layer into another predetermined configuration to remain a residual grain growth preventing layer in a bottom region of the first electrode; f) carrying out a first meta-stable poly silicon (MPS) grain growth process in order to grow up first MPS grains on an inner wall of the first electrode except on the bottom region covered with the residual grain growth preventing layer; g) removing the residual grain growth preventing layer to expose the bottom region of the first electrode; h) removing the sacrifice insulating layer that embraces the first electrode; i) forming a dielectric layer on the first electrode; and j) forming a second electrode on the top face of the dielectric layer.

In accordance with another aspect of the present invention, there is provided a capacitor in a semiconductor device, comprising: a semiconductor substrate provided with conductive regions; an ILD layer formed on the semiconductor substrate except at contact plugs connected to the conductive regions; an etch barrier layer formed on the ILD layer; a first electrode formed on the contact plugs and portions of the ILD layer, wherein first MPS grains are formed on the first electrode except on the bottom region thereof; a dielectric layer formed on the first electrode; and a second electrode formed on the dielectric layer.

In accordance with further another aspect of the present invention, there is provided a capacitor in a semiconductor device, comprising: a semiconductor substrate provided with conductive regions; an ILD layer formed on the semiconductor substrate except at contact plugs connected to the conductive regions; an etch barrier layer formed on the ILD layer; a first electrode formed on the contact plugs and portions of the ILD layer, wherein first MPS grains are formed on the first electrode except on a bottom region thereof and second MPS grains are formed on the bottom region thereof, in which the sizes of the second MPS grains are smaller than those of the first MPS grains; a dielectric layer formed on the first electrode; and a second electrode formed on the dielectric layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

There are provided in FIG. 2 and FIGS. 3A to 3G cross sectional views setting forth an inventive capacitor in a semiconductor device and a method for manufacturing the capacitor in accordance with a first preferred embodiment of the present invention.

Figure 1A:
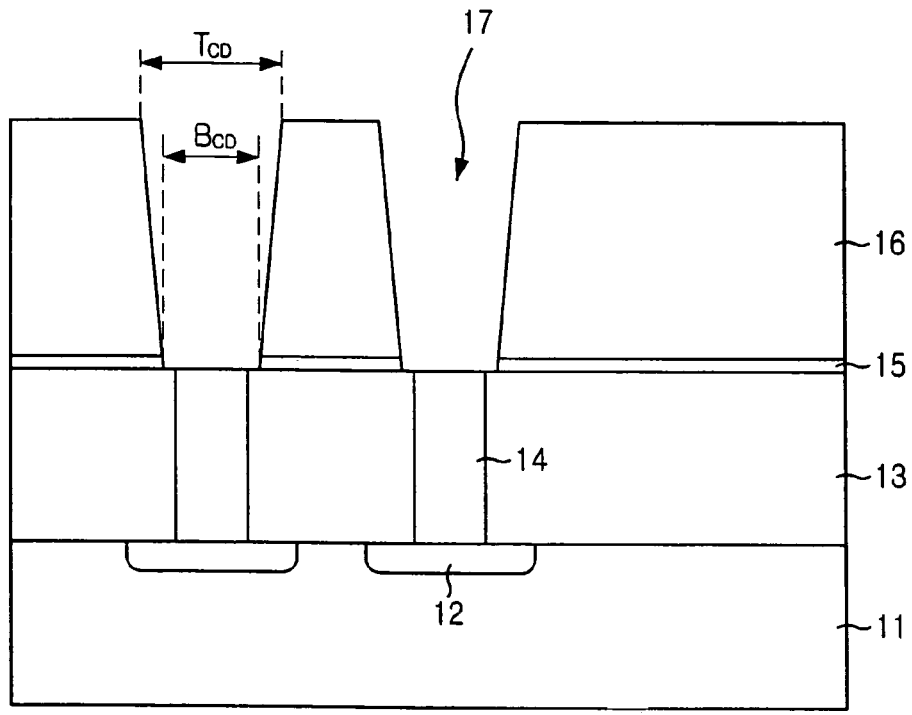
FIGS. 1A to 1D are cross sectional views setting forth a conventional method for forming a capacitor in a semiconductor device.
Figure 1B:
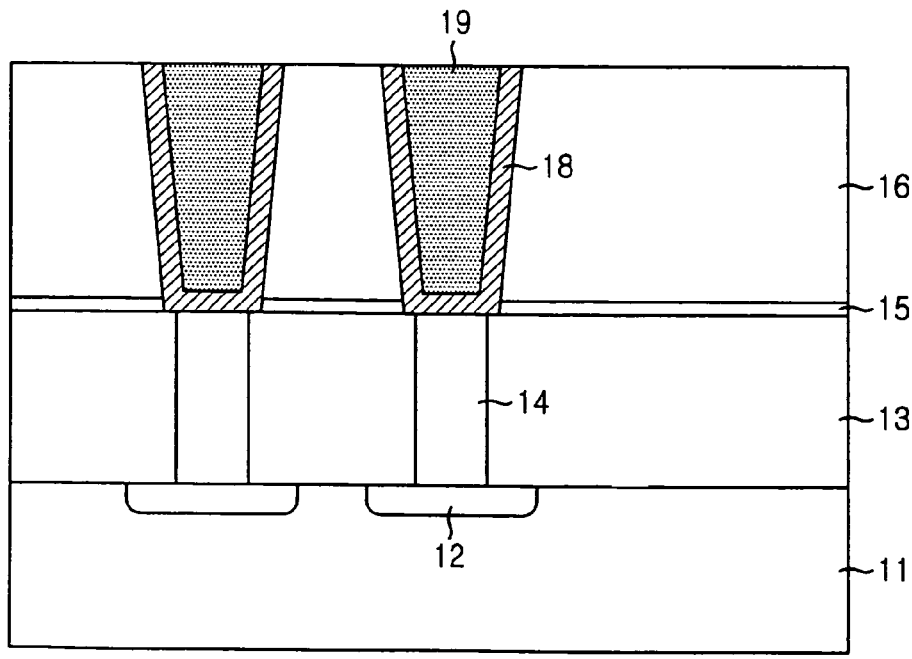
Figure 1C:
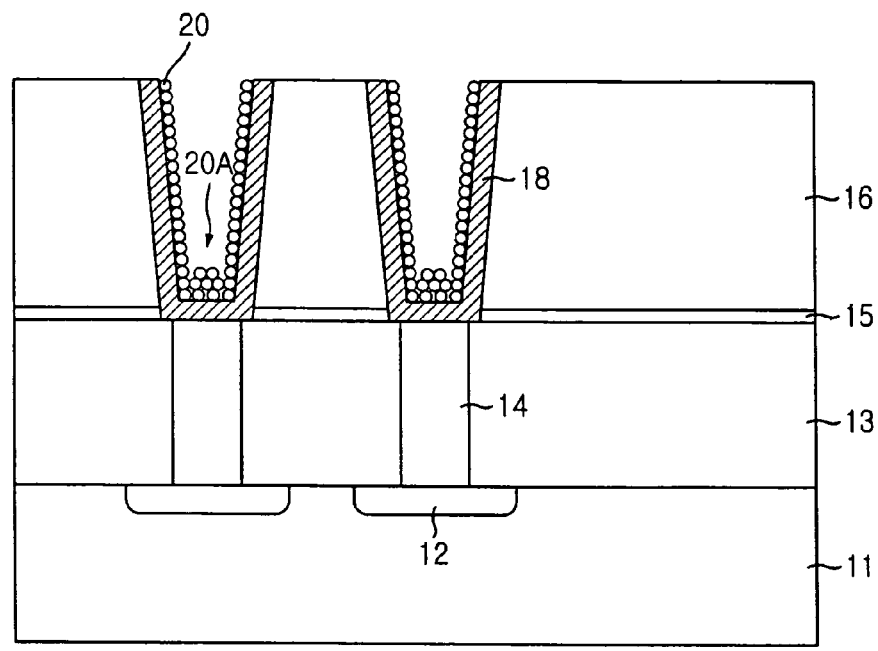
Figure 1D:
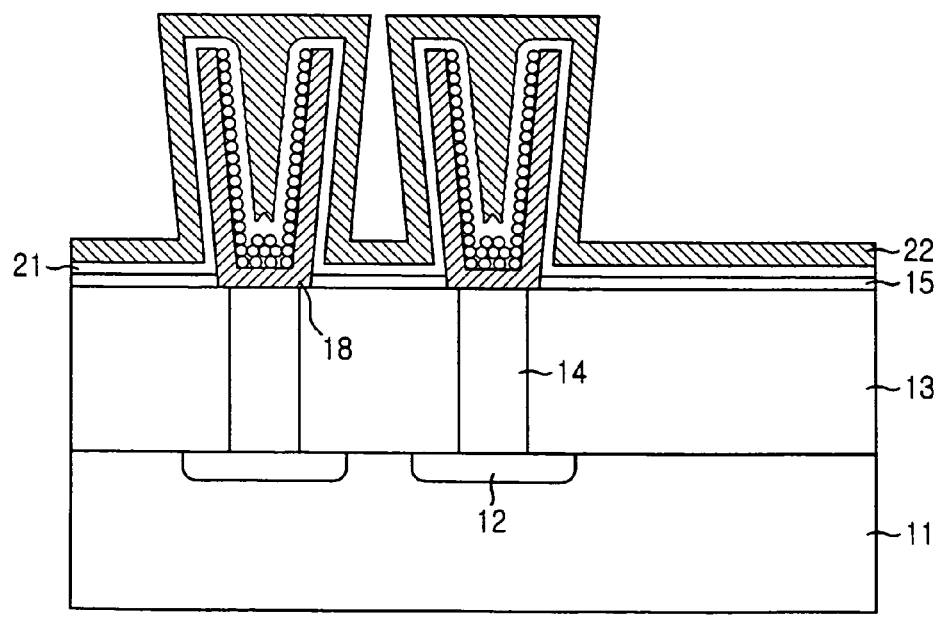
Figure 2:
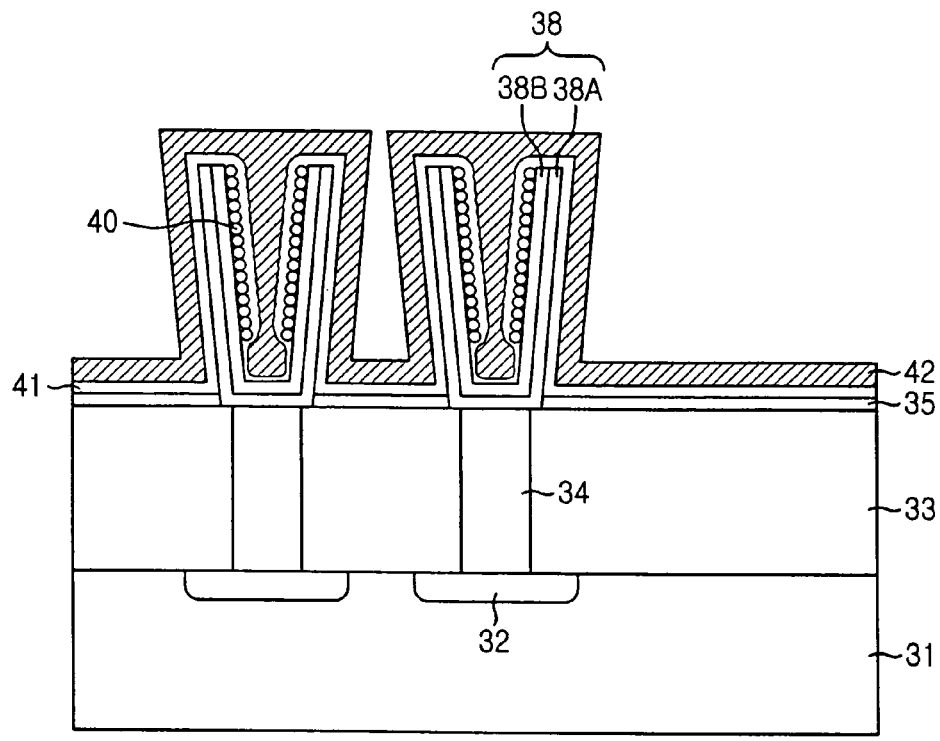
FIG. 2 is a cross sectional view setting forth a capacitor in a semiconductor device in accordance with a first preferred embodiment of the present invention.

In FIG. 2, a cylinder typed capacitor includes a first electrode 38 of which a top critical dimension is larger than a bottom critical dimension, MPS grains 40 formed on an inner wall of the first electrode 38B except on a bottom region, a dielectric layer 41 formed on the first electrode 38 and a second electrode 42 formed on the dielectric layer 41.

Here, the first electrode 38 is a double layer provided with an undoped amorphous silicon layer 38B formed as an inner wall of the first electrode 38 and a doped amorphous silicon 38A layer formed as an outer wall of the first electrode 38. A bottom face of the first electrode 38 is supported by an etch barrier layer 35.

In addition, the first electrode 38 is connected to a conductive region 32 of a semiconductor substrate 31 vertically through a contact plug 34. The semiconductor substrate 31 is the substrate doped with impurities, wherein the conductive region 32 is an impurity-doped region such as source/drain region of a transistor. The contact plug 34 connects the conductive region 32 and the first electrode 38 through an inter-layer dielectric (ILD) layer 33.

In accordance with the first embodiment of the present invention, the MPS grains 40 are formed on a sidewall of the inner wall of the first electrode 38 except on a bottom region, thereby securing capacitance of the capacitor sufficiently.

Referring to FIGS. 3A to 3G, there are shown cross sectional views illustrating a method for manufacturing a capacitor in accordance with a first preferred embodiment of the present invention.

Figure 3A:
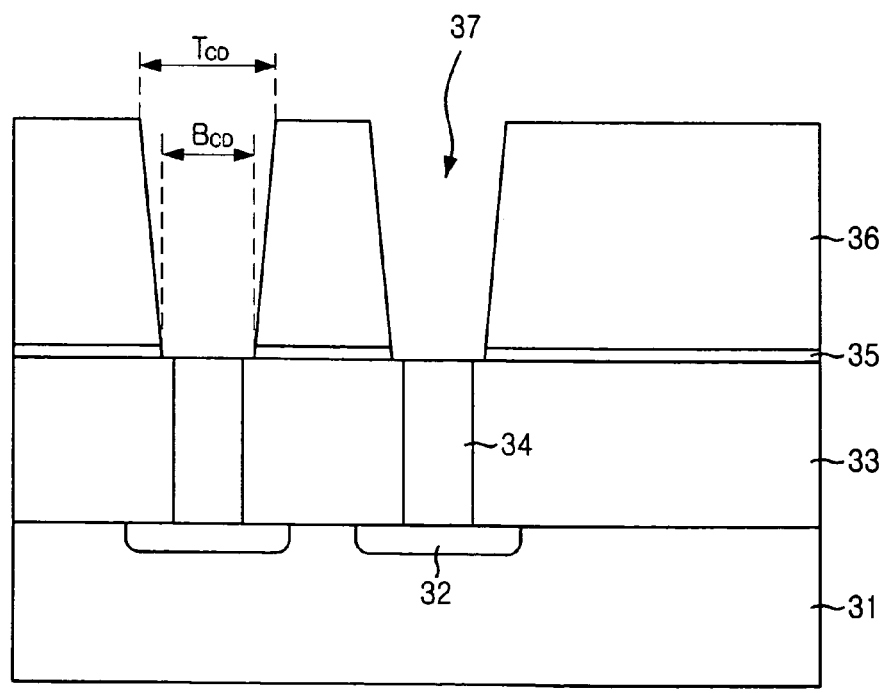
FIGS. 3A to 3G are cross sectional views setting forth a method for manufacturing a capacitor in a semiconductor device in accordance with a first preferred embodiment of the present invention.

Referring to FIG. 3A, the manufacturing process begins with preparation of a semiconductor substrate 31 having a conductive region 32 doped with impurities, i.e., source/drain region.

Thereafter, an ILD layer 33 is formed on the top face of the semiconductor substrate 31 and is patterned into a predetermined configuration by using a contact mask to form a contact hole till the contact hole is completely filled in. Next, a conductive layer is deposited on entire surface including the contact hole. Subsequently, a contact plug 34 is formed by using a technique such as a chemical-mechanical (CMP) process and an etch-back process, wherein polysilicon plug or tungsten plug is generally used as the contact plug 34.

The contact plug 34 is generally referred as a storage node contact. In case of using polysilicon plug as the storage node contact, an ohmic contact layer and a barrier layer are formed on the polysilicon plug, subsequently. Here, titanium silicide may be utilized as the ohmic contact layer and titanium nitride (TiN) may be used as the barrier layer. The titanium silicide layer plays a role in improving contact resistance between the polysilicon plug and the first electrode. Furthermore, the titanium nitride layer is used as a diffusion barrier layer that prevents mutual diffusion between the polysilicon and the first electrode.

In an ensuing step, an etch barrier layer 35 and a sacrifice insulating layer 36 are deposited on the ILD layer 33 and the contact plug 34 subsequently. At this time, material for use in the etch barrier layer 35 has an etch selectivity against the sacrifice insulating layer 36. Especially, a nitride layer is widely used as the etch barrier layer 35. The sacrifice insulating layer 36 is made of a material selected from the group consisting of an undoped silicated glass (USG), a plasma enhanced tetraethyl orthosilicate (PETEOS) and a low pressure tetra ethyl orthosilicate (LPTEOS). In addition, the sacrifice insulating layer 36 may be made of a single layer or a double layer. It is preferable that the height of the sacrifice insulating layer 36 should be high for the sake of high capacitance of the capacitor, e.g, 15,000 Å to 25,000 Å. However, if the height of the sacrifice insulating layer 36 is beyond 25,000 Å, an etch process will not be carried out sufficiently owing to the limitation of an etching apparatus. Therefore, the height should be near to 25,000 Å.

Thereafter, the sacrifice insulating layer 36 is patterned into another predetermined configuration using a mask to define a first electrode region. Subsequently, the etch barrier layer 35 is etched till the contact plug 34 is exposed completely, whereby an opening 37 is obtained. Here, since the height of the sacrifice insulating layer 36 is so high, the opening 37 has a figure of an inverse trapezoid in cross section. That is, a top critical dimension is larger than a bottom critical dimension.

Figure 3B:
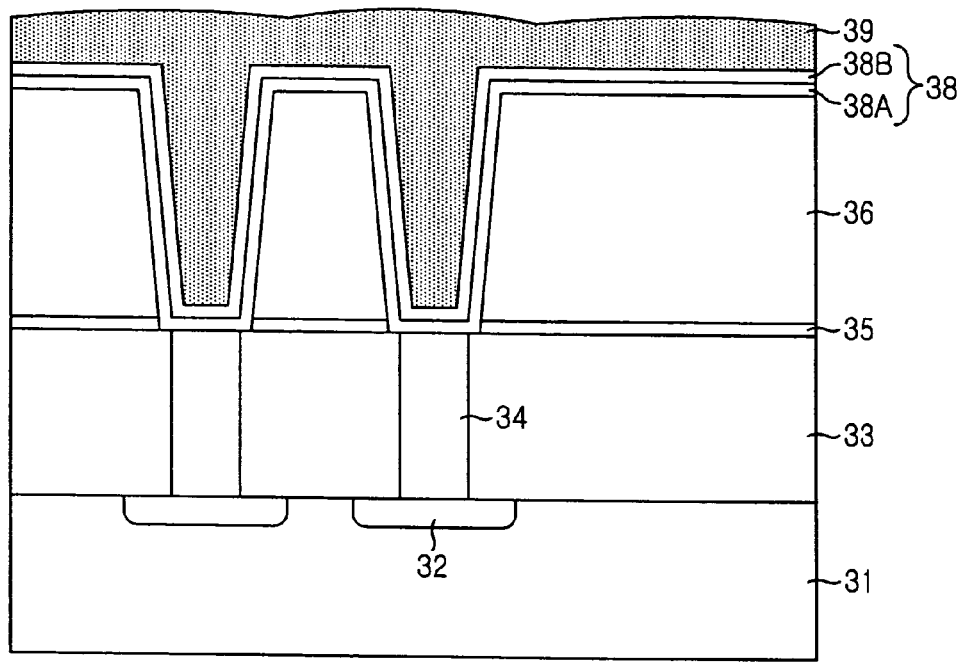

In a next step as described in FIG. 3B, a doped amorphous silicon layer 38A and an undoped amorphous silicon layer 38B are deposited on the sacrifice insulating layer 36 and the opening 37 by in-situ, wherein each amorphous silicon layers 38A, 38B has the thickness in the range of approximately 100 Å to approximately 300 Å so that the total thickness of the amorphous silicon layers ranges from approximately 300 Å approximately to 500 Å.

Thereafter, a grain growth preventing layer 39 is formed on the undoped amorphous silicon layer 38B till the opening 37 is completely filled in. The material for use in the grain growth preventing layer 39 has a characteristic of the high etching selectivity against the sacrifice insulating layer 36. For example, in case of using the USG or the TEOS as the sacrifice insulating layer 36, it is preferable to use a spin on glass (SOG), a boron and phosphorous doped silicate glass (BPSG) or a phosphorous doped silicate glass (PSG).

Meanwhile, in case of using the SOG as the grain growth preventing layer 39, the SOG is formed on the undoped amorphous silicon layer 38B till the opening 37 is completely filled in. Thereafter, the SOG layer is annealed at a temperature raging from approximately 400° C. to approximately 500° C.

Figure 3C:
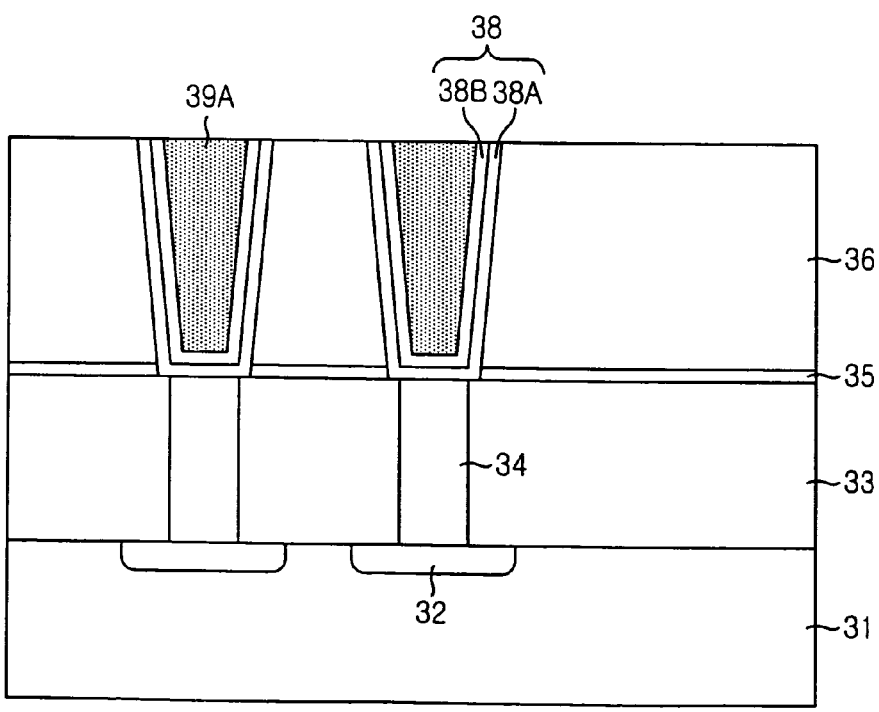

In a subsequent step as depicted in FIG. 3C, the grain growth preventing layer 39 is removed using the CMP technique or the etch back process. Therefore, first electrodes 38 are obtained, wherein they are isolated electrically. The first electrodes 38 include the doped amorphous silicon layer 38A and the undoped amorphous silicon layer 38B. The doped and undoped amorphous silicon layers 38A, 38B are removed by CMP technique or the etch back process so that they are remained only in the opening 37.

As mentioned above, the grain growth preventing layer 39 plays a role to prevent the doped and the undoped amorphous silicon layers 38A, 38B from being removed during the CMP or the etch back process.

Figure 3D:
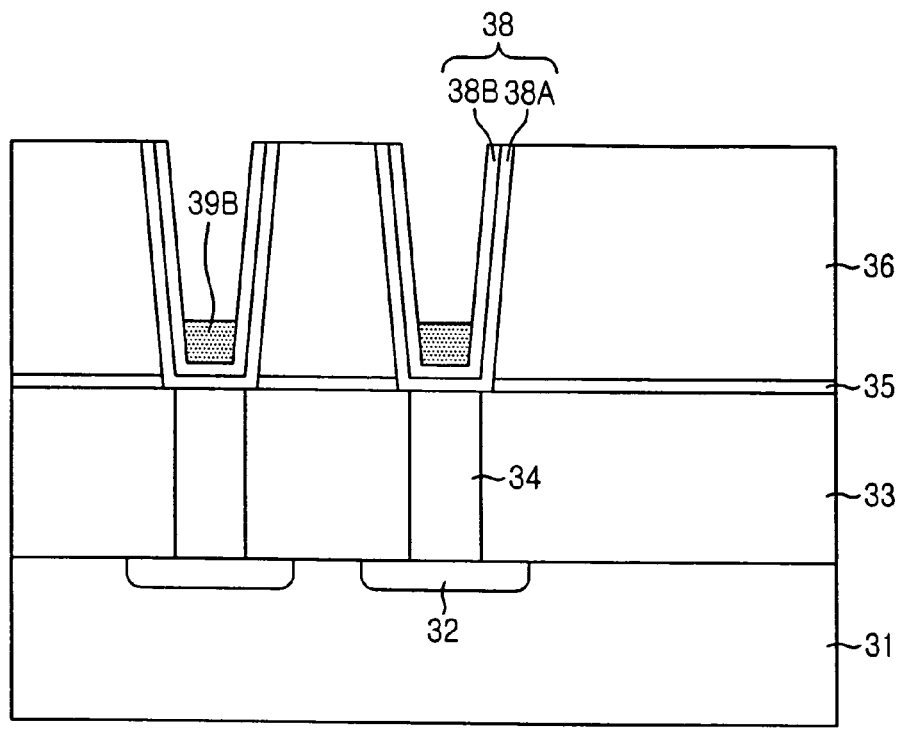

In a following step as described in FIG. 3D, the grain growth preventing layer 39A remained in the opening 37 is etched partially, whereby a residual grain growth preventing layer 39B is still remained on the bottom area of the opening 37 with a uniform thickness. At this time, the etch process is carried out using the difference of the etching selection ratio between the grain growth preventing layer 39 and the sacrifice insulating layer 36. That is, because the etching selection ratio of the sacrifice insulating layer 36 is eminently smaller than that of the grain growth preventing layer 39, the sacrifice insulating layer 36 is not harmed during the etch process of the grain growth preventing layer 39. In addition, since the etching selection ratio of the first electrodes 38 is smaller than that of the grain growth preventing layer 39, the first electrodes is not harmed, too. In the embodiment of the present invention, the sacrifice insulating layer 36 and the grain growth preventing layer 39 are etched using hydrofluoric acid solution that is diluted at a ratio 50:1. In this case, the etching selection ratio of the TEOS or the USG for use in the sacrifice insulating layer 36 is approximately 1.8 Å/second. On the other hand, the PSG, the BPSG and the SOG have the etching selection ratio of approximately 25 Å/second, 15 Å/second and 30 Å/second, respectively. That is, the etching selection ratio of the grain growth preventing layer 39 is about 8 times higher than that of the sacrifice insulating layer 36. The residual grain growth preventing layer 39B should have the sufficient thickness to cover the region where the merging phenomenon happened during a post MPS grain growth process. For the sake of this, after the top and bottom critical dimensions of the opening 37 should be measured, the MPS grain growth-degree should be determined relatively. In other words, the grain growth preventing layer 39 is etched partially in a wet bath using wet chemical, e.g., HF solution diluted at the ratio of 50:1. The thickness of the residual grain growth preventing layer 39 can be controlled by adjusting an etching time.

Figure 3E:
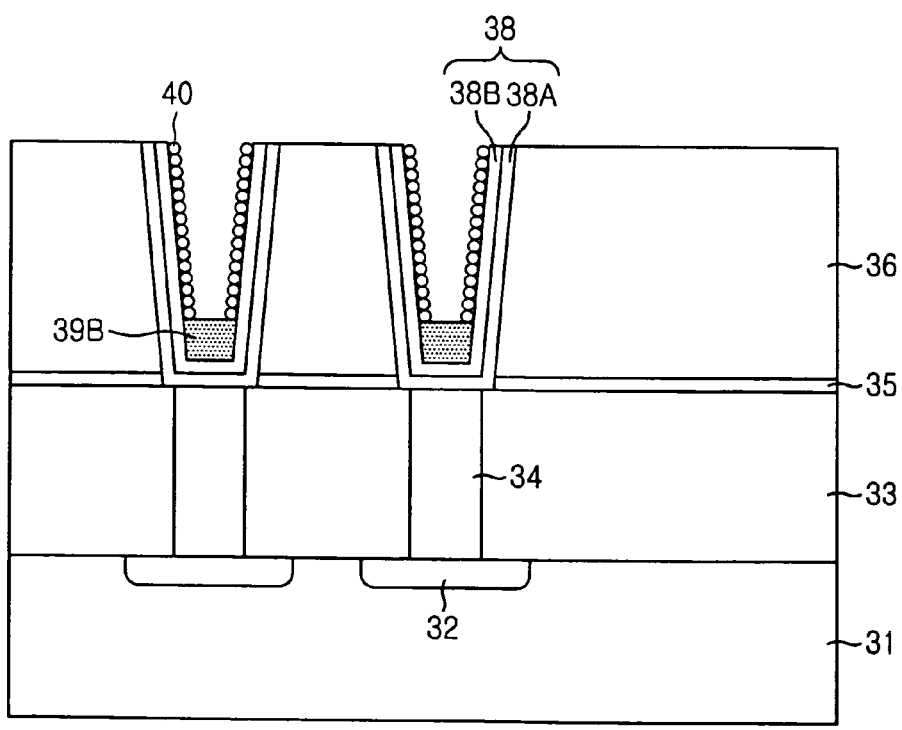

In an ensuing step as depicted in FIG. 3E, MPS grains 40 are formed for increasing the surface area on the undoped amorphous silicon layer 38B. The MPS grains 40 are grown up on condition that the temperature ranges from approximately 600° C. to approximately 650° C., for increasing the cross section area. Preferably, the MPS grain growth process should be carried out on condition that an increment ratio of the cross section area ranges from approximately 1.7 to approximately 2.0. Here, the increment ratio of the cross section area means the ratio between the cross section area before the MPS grains 40 are grown up and the cross section area after the MPS grains 40 are grown up.

Figure 3F:
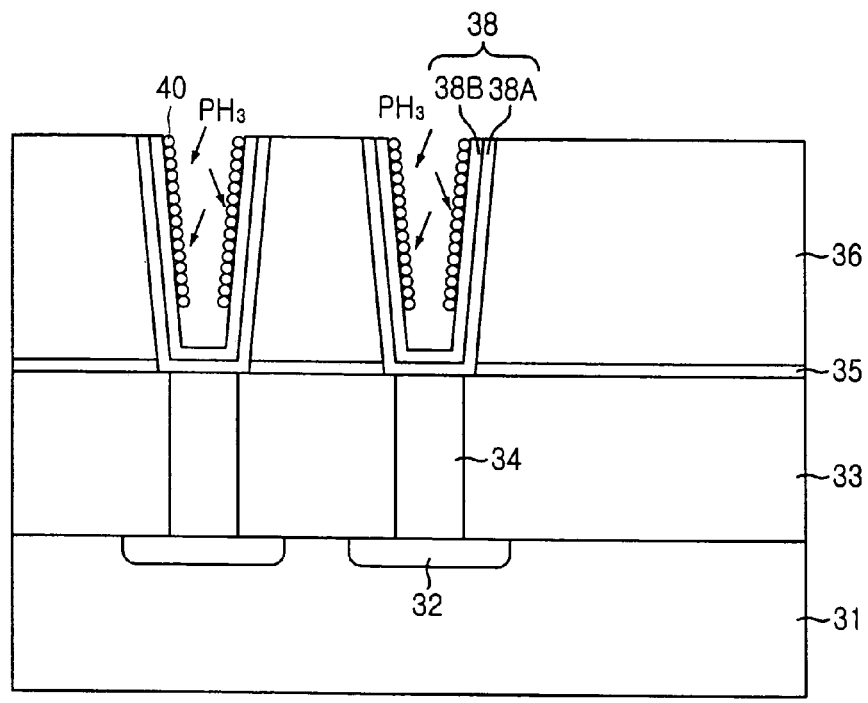

In a following step as described in FIG. 3F, the residual grain growth preventing layer 39B is removed completely by the etch process. The etch process is carried out using the difference of the etching selection ratio between the sacrifice insulating layer 36 and the grain growth preventing layer 39. Thus, the sacrifice insulating layer 36 is not harmed during the etch process. Subsequently, phosphorous is doped into the undoped amorphous silicon layer 38B to increase the silicon dopant concentration in the undoped amorphous silicon layer 38B. It is possible to diffuse phosphorous into the undoped amorphous silicon layer 38B by using phosphine ($PH_3$) gas as reaction gas. Through the phosphorous doping process, a phosphorous concentration in the undoped amorphous silicon layer 38B becomes in the range of approximately $1 \times 10^{22}/cm^3$ to approximately $5 \times 10^{22}/cm^3$.

Figure 3G:
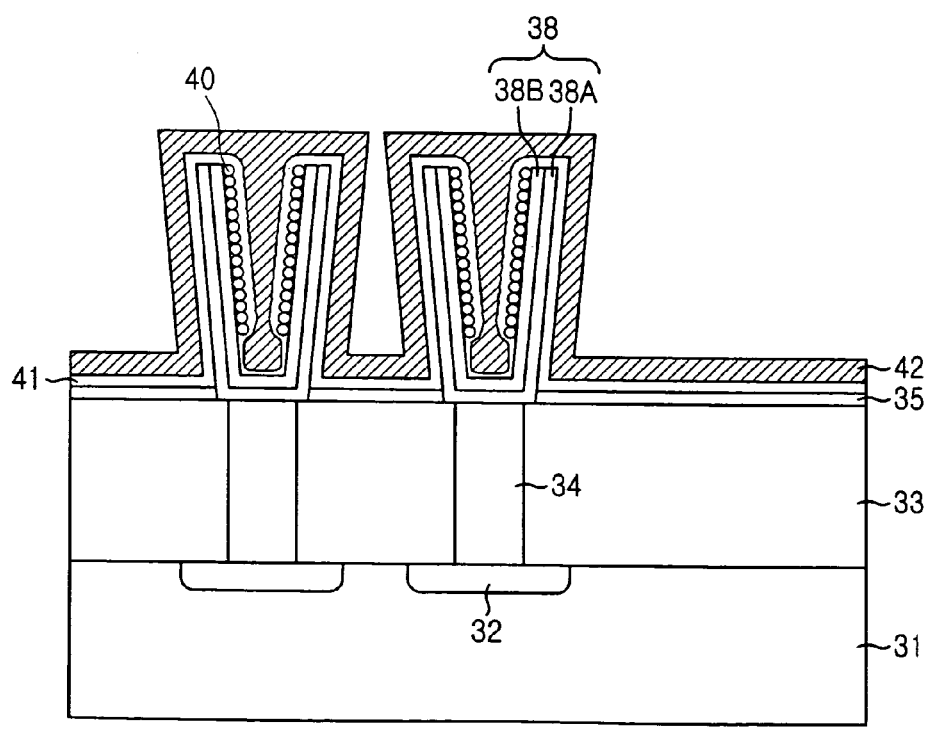

In a next step as depicted in FIG. 3G, the sacrifice insulating layer 36 is removed through a dip-out process by utilizing the etch barrier layer 35 as the etch mask, thereby exposing the first electrode 38. Here, the dip-out process is carried out using wet chemical such as buffered oxide etchant (BOE) and HF. But, in case of fabricating the first electrode 38 of a concave type, the dip-out process is not carried out.

Finally, a dielectric layer 41 is deposited on the resultant including the first electrode 38 and then a second electrode 42 is formed on the dielectric layer 41. The dielectric layer 41 employs an oxidized silicon nitride layer, tantalum oxide layer, aluminum oxide layer or hafnium oxide layer. The second electrode 42 can be formed by using a single layer of the doped polysilicon layer or by using a double layers of doped polysilicon/titanium nitride.

There are provided in FIG. 4 and FIGS. 5A to 5G cross sectional views setting forth an inventive capacitor in a semiconductor device and a method for manufacturing the capacitor in accordance with a second preferred embodiment of the present invention.

Figure 4:
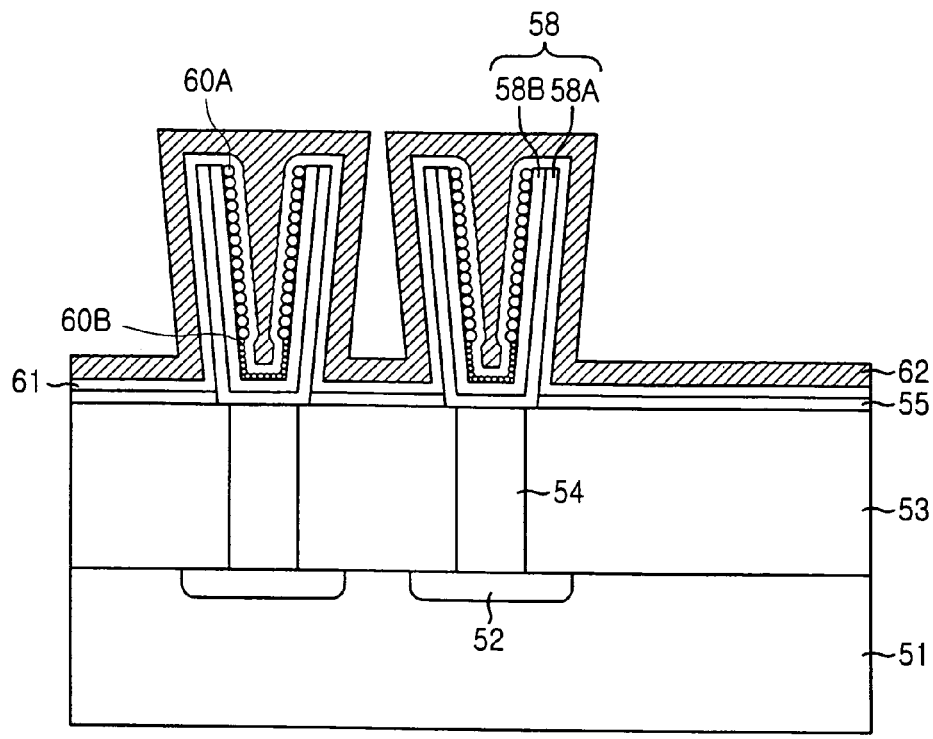
FIG. 4 is a cross sectional view setting forth a capacitor in a semiconductor device in accordance with a second preferred embodiment of the present invention.

In FIG. 4, a cylinder typed capacitor includes a first electrode 58 of which a top critical dimension is larger than a bottom critical dimension, a first region provided with second MPS grains 60B formed around a bottom area of the first electrode 58, a second region provided with first MPS grains 60A of which sizes are larger than those of the second MPS grains 60B, a dielectric layer 61 formed on the first electrode 58 having the first region and the second region, and a second electrode 62 formed on the dielectric layer 61. The first MPS grains 60A are formed on an inner wall of the first electrode 58 except on the bottom area, i.e., the first region.

The first electrode 58 is a double layer provided with an undoped polysilicon layer 58B formed on the inner wall of the first electrode 58 and a doped polysilicon layer 58A formed on the outer wall of the first electrode 58. A bottom face of the first electrode 38 is supported by an etch barrier layer 55.

In addition, the first electrode 58 is connected to a conductive region 52 of a semiconductor substrate 51 vertically through a contact plug 54. The semiconductor substrate 51 is the substrate doped with impurities, wherein the conductive region 52 is an impurity-doped region such as source/drain region of a transistor. The contact plug 54 connects the conductive region 52 and the first electrode 58 through an interlayer dielectric (ILD) layer 53.

In accordance with the second embodiment of the present invention, the first electrode 58 includes the first region and the second region, wherein the first region has the second MPS grains 60B that are small enough to prevent the merging phenomenon and the second region has the first MPS grains 60A that are larger than those of the second MPS grains 60B. Therefore, it is possible to obtain a sufficient capacitance. Namely, the increment ratio of the cross section area of the first region is lower than that of the second region, wherein the increment ratio of the cross section area of the first region ranges from approximately 1.1 to approximately 1.5 and the increment ratio of the cross section area of the second region ranges from approximately 1.7 to approximately 2.0. Additionally, the second MPS grains 60B formed in the bottom area of the first electrode 58 are small enough to prevent the merging phenomenon, thereby having good step coverage of the dielectric layer 61.

Referring to FIGS. 5A to 5G, there are shown cross sectional views setting forth a method for manufacturing a capacitor in accordance with a second embodiment of the present invention.

Figure 5A:
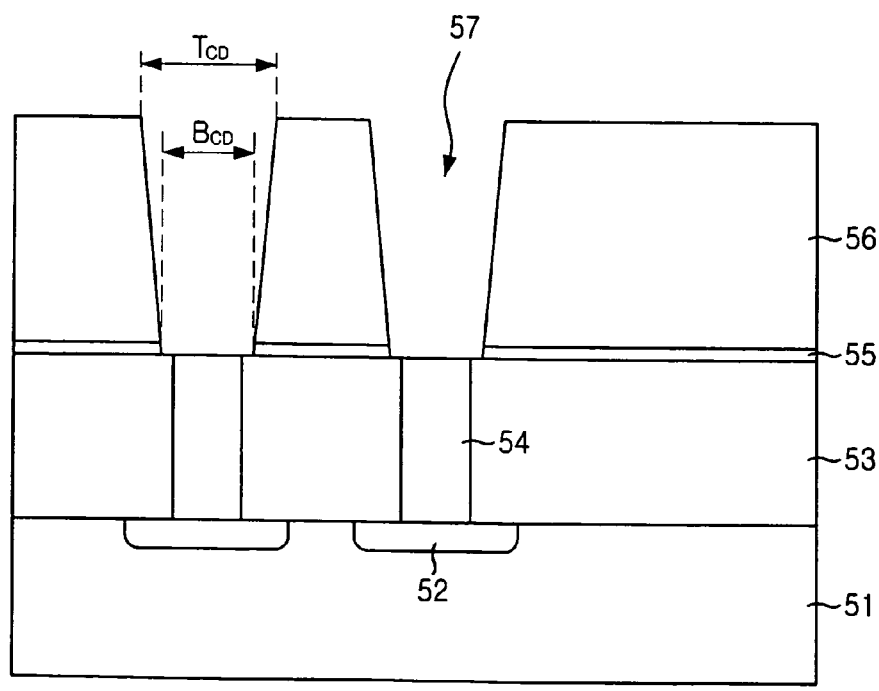
FIGS. 5A to 5G are cross sectional views setting forth a method for manufacturing a capacitor in a semiconductor device in accordance with a second preferred embodiment of the present invention.

Referring to FIG. 5A, the manufacturing process begins with preparation of a semiconductor substrate 51 having a conductive region 52 doped with impurities, i.e., source/drain region.

Thereafter, an ILD layer 53 is formed on the top face of the semiconductor substrate 51 and is patterned into a predetermined configuration by using a contact mask to form a contact hole. Next, a conductive layer is deposited on entire surface including the contact hole till the contact hole is completely filled in. Subsequently, a contact plug 54 is formed by using a technique such as the CMP and the etch-back process, wherein polysilicon plug or tungsten plug is generally used as the contact plug 54.

The contact plug 54 is generally referred as a storage node contact. In case of using polysilicon plug as the storage node contact, an ohmic contact layer and a barrier layer are formed on the polysilicon plug, subsequently. Here, titanium silicide may be utilized as the ohmic contact layer and titanium nitride (TiN) may be used as the barrier layer. The titanium silicide layer plays a role in improving contact resistance between the polysilicon plug and the first electrode. Furthermore, the titanium nitride layer is used as a diffusion barrier layer that prevents mutual diffusion between the polysilicon and the first electrode.

In an ensuing step, an etch barrier layer 55 and a sacrifice insulating layer 56 are deposited on the ILD layer 53 and the contact plug 54 subsequently. At this time, material for use in the etch barrier layer 55 has an etch selectivity against the sacrifice insulating layer 56. Especially, a nitride layer is widely used as the etch barrier layer 55. The sacrifice insulating layer 56 is made of a material selected from the group consisting of USG, PETEOS and LPTEOS. In addition, the sacrifice insulating layer 56 may be made of a single layer or a double layer. It is preferable that the height of the sacrifice insulating layer 56 should be high for the sake of high capacitance of the capacitor, e.g, 15,000 Å to 25,000 Å. However, if the height of the sacrifice insulating layer 56 is over than 25,000 Å, an etch process will not be carried out sufficiently owing to the limitation of an etching apparatus. Therefore, the height should be near to 25,000 Å.

Thereafter, the sacrifice insulating layer 56 is patterned into another predetermined configuration using a mask to define a first electrode region. Subsequently, the etch barrier layer 55 is etched till the contact plug 54 is exposed completely, whereby an opening 57 is obtained. The opening 57 is referred as a concave pattern. Here, since the height of the sacrifice insulating layer 56 is so high, the opening 57 has a figure of an inverse trapezoid in cross section. That is, a top critical dimension is larger than a bottom critical dimension.

Figure 5B:
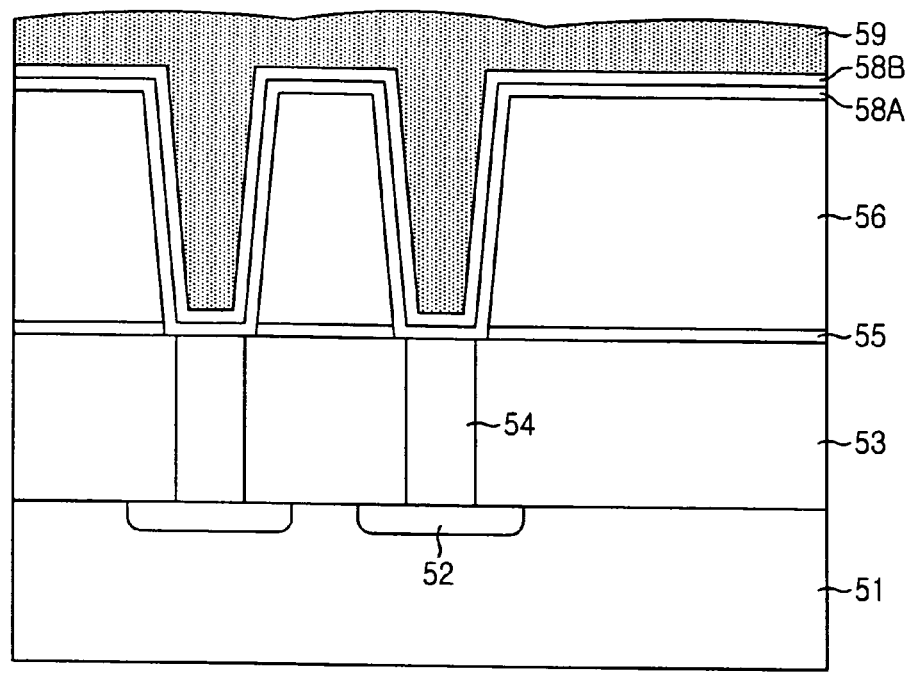

In a next step as described in FIG. 5B, a doped amorphous silicon layer 58A and an undoped amorphous silicon layer 58B are deposited on the sacrifice insulating layer 56 and the opening 57 by in-situ, wherein each amorphous silicon layer 58A, 58B has the thickness in the range of approximately 100 Å to approximately 300 Å so that the total thickness of the amorphous silicon layers range from approximately 300 Å to approximately 500 Å.

Thereafter, a grain growth preventing layer 59 is formed on the undoped amorphous silicon layer 58B till the opening 57 is completely filled in. The material for use in the grain growth preventing layer 59 has a characteristic of the high etching selectivity against the sacrifice insulating layer 56. For example, in case of using the USG or the TEOS as the sacrifice insulating layer 56, it is preferable to use SOG, BPSG or PSG.

Meanwhile, in case of using the SOG as the grain growth preventing layer 59, the SOG is formed on the undoped amorphous silicon layer 58B till the opening 57 is completely filled in. Thereafter, the SOG layer is annealed at a temperature raging from approximately 400° C. to approximately 500° C.

Figure 5C:
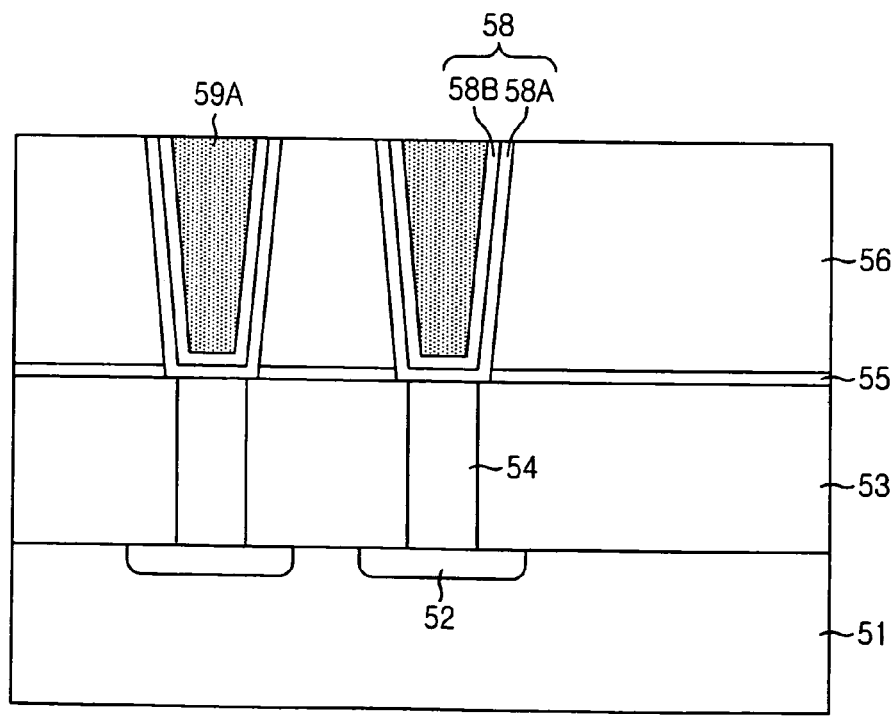

In a subsequent step as depicted in FIG. 5C, the grain growth preventing layer 59 is removed using the CMP technique or the etch back process. Therefore, first electrodes 58 are obtained, wherein they are isolated electrically. The first electrodes 58 include the doped amorphous silicon layer 58A and the undoped amorphous silicon layer 58B. The doped and undoped amorphous silicon layers 58A, 58B are removed by CMP technique or the etch back process so that they are remained only in the opening 57.

As mentioned above, the grain growth preventing layer 59 plays a role to prevent the doped and the undoped amorphous silicon layers 58A, 58B from being removed during the CMP or the etch back process.

Figure 5D:
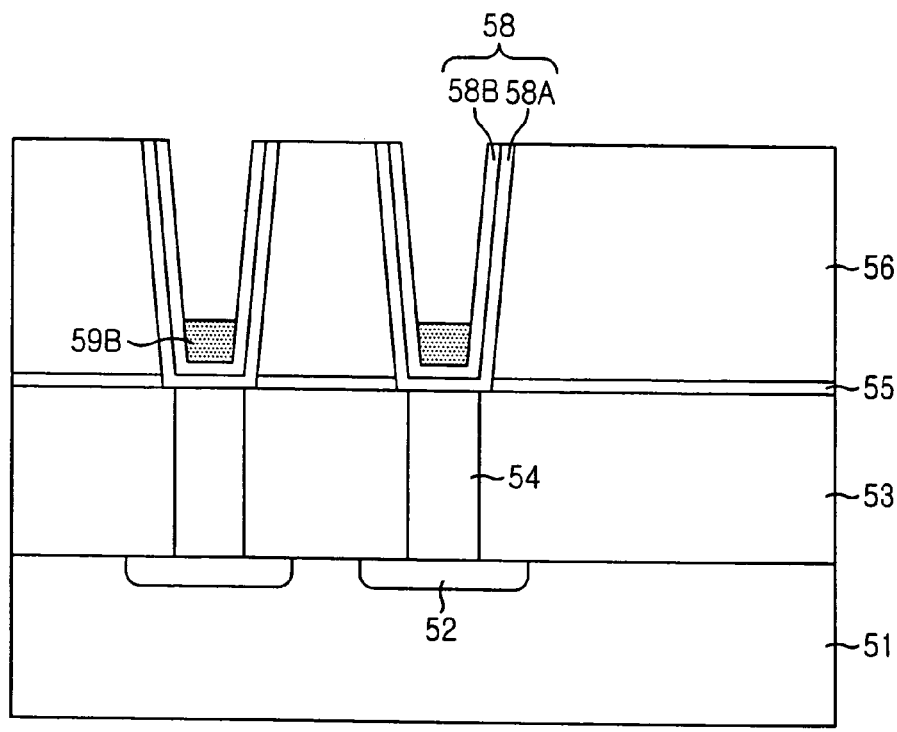

In a following step as described in FIG. 5D, the grain growth preventing layer 59A remained in the opening 57 is etched partially, whereby a residual grain growth preventing layer 59B is still remained on a bottom area of the opening 57 with a uniform thickness. At this time, the etch process is carried out using the difference of the etching selection ratio between the grain growth preventing layer 59 and the sacrifice insulating layer 56. That is, because the etching selection ratio of the sacrifice insulating layer 56 is eminently smaller than that of the grain growth preventing layer 59, the sacrifice insulating layer 56 is not harmed during the etch process of the grain growth preventing layer 59. In addition, since the etching selection ratio of the first electrodes 58 is smaller than that of the grain growth preventing layer 59, the first electrodes is not harmed, too.

The residual grain growth preventing layer 59B should have the thickness to cover the region of the merging phenomenon may be happened during a post MPS grain growth process. For the sake of this, after the top and bottom critical dimensions should be measured, the MPS grain growth-degree should be determined relatively. In other words, the grain growth preventing layer 59 is etched partially in a wet bath using wet chemical, e.g., HF acid solution diluted at the ratio of 50:1. The thickness of the residual grain growth preventing layer 59 can be controlled by adjusting an etching time.

Figure 5E:
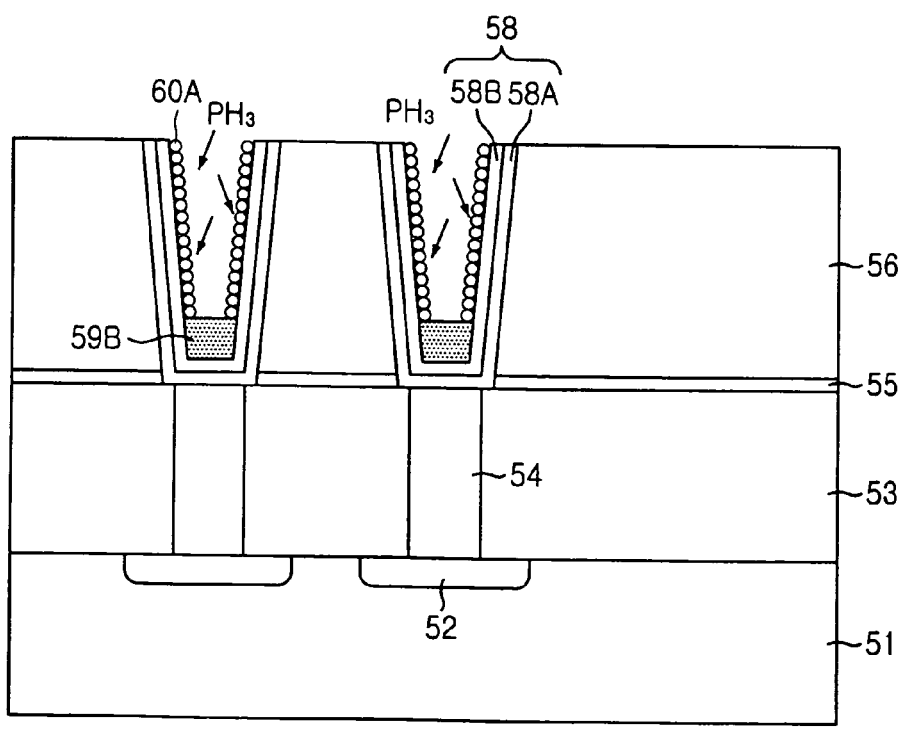

In an ensuing step as depicted in FIG. 5E, the first MPS grains 60A are formed on the inner wall of the first electrode 58. That is, the first MPS grains 60A are formed on the surface of the undoped amorphous silicon layer 58B except on the bottom region covered with the residual grain growth preventing layer 59B. A width of the top region of the inner wall area 58B is much wider than that of the bottom region covered with the residual grain growth preventing layer 59B.

The first MPS grains 60A are grown up on condition that the temperature ranges from approximately 600° C. to approximately 650° C., for increasing the cross section area. Preferably, the MPS grain growth process should be carried out on condition that an increment ratio of the cross section area ranges from approximately 1.7 to approximately 2.0.

Subsequently, phosphorous is doped into the undoped amorphous silicon layer 58B to increase the silicon dopant concentration in the undoped amorphous silicon layer 58B. It is possible to diffuse phosphorous into the undoped amorphous silicon layer 58B by using phosphine gas as reaction gas. Through the phosphorous doping process, a phosphorous concentration in the undoped amorphous silicon layer 38B ranges from approximately $\times 10^{22}/cm^3$ to approximately $5 \times 10^{22}/cm^3$.

Figure 5F:
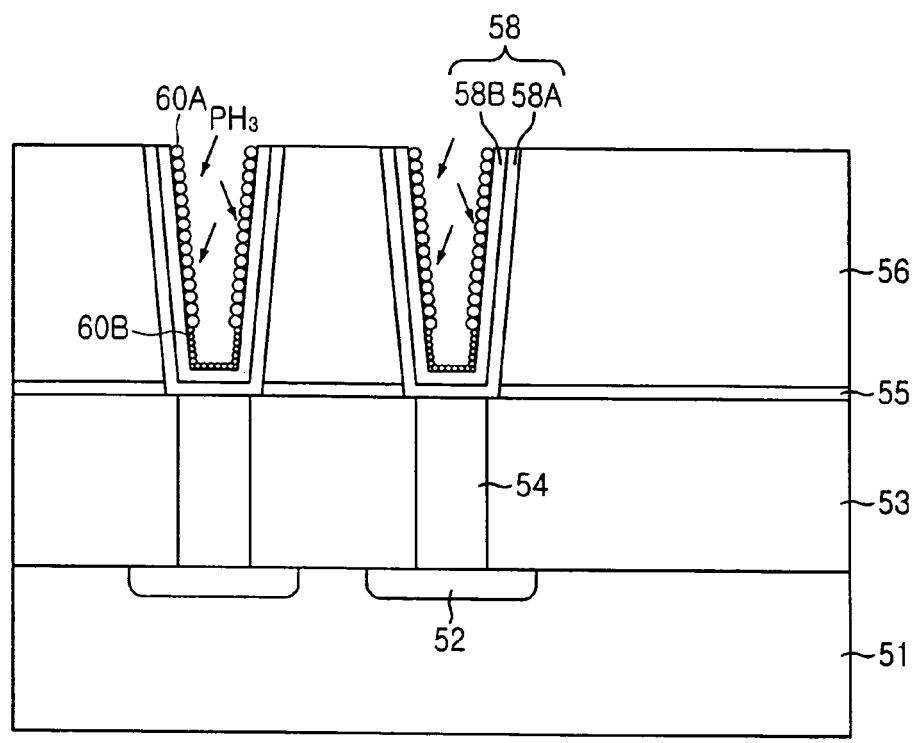

In a next step as described in FIG. 5F, the residual grain growth preventing layer 59B is removed by making use of the difference of the etching selection ratio between the protection layer 56 and the residual grain growth preventing layer 59B. Thus, the protection layer 56 is not harmed during the etch process. This etch process is carried out in the wet bath using HF solution.

Thereafter, second MPS grains 60B are formed on the bottom area of the first electrode 58. While the second MPS grains 60B are grown up, the first MPS grains are not grown up anymore because phosphine gas is densely doped thereinto. Therefore, the second MPS grains 60B are formed only on the bottom area where the residual grain growth preventing layer 59B is stripped off. Since the width of the bottom area is narrower than that of the top area, it is necessary to control the process condition suitably for preventing the merging phenomenon between the MPS grains. Namely, the MPS grain growth process is carried on the condition that the temperature ranges from approximately 600° C. to approximately 610° C. and the increment ratio of the cross section area ranges from approximately 1.1 to approximately 1.5. Making a comparison between the first MPS grains 60A and the second MPS grains 60B, the increment ratio of the cross section area of the second MPS grains 60B is lower than that of the first MPS grains 60A.

During the MPS grain growth process, a seeding process and an annealing process are carried out respectively. At this time, in case of the same seeding process, the increment ratio of the cross section area increases, as the annealing time is lengthened and vice versa. In case of the same annealing process, the more seeding process the smaller the increment ratio of the cross section area.

Therefore, in order to increase the increment ratio of the cross section area of the first MPS grains 60A rather than that of the second MPS gains 60B, the annealing time during the first MPS grain growth process should be longer than the second MPS grain growth process, in case of the same seeding process. In addition, in case of the same annealing process, the seeding during the first MPS grain growth process should be less carried out in comparison with the second MPS grain growth process.

Subsequently, phosphorous is doped into the undoped amorphous silicon layer 58B where the second MPS grains 60B are grown up, for increasing the silicon dopant concentration in the undoped amorphous silicon layer 58B. It is possible to diffuse phosphorous into the undoped amorphous silicon layer 58B by using phosphine gas as reaction gas. Through the phosphorous doping process, a phosphorous concentration in the undoped amorphous silicon layer 38B ranges from approximately $1 \times 10^{22}/cm^3$ to approximately $5 \times 10^{22}/cm^3$.

Figure 5G:
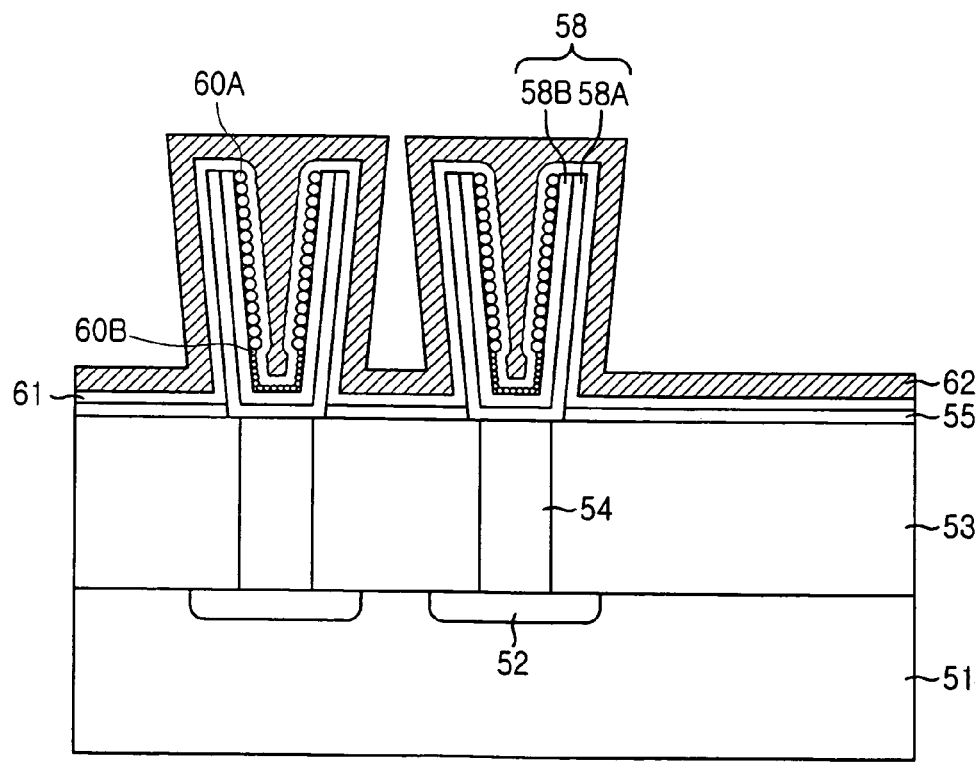

In a next step as depicted in FIG. 5G, the sacrifice insulating layer 56 is removed through a dip-out process by utilizing the etch barrier layer 55 as the etch mask, thereby exposing the first electrode 58. Here, the dip-out process is carried out using wet chemical such as BOE and HF. But, in case of fabricating the first electrode 58 of a concave type, the dip-out process is not carried out.

Finally, a dielectric layer 61 is deposited on the entire surface including the first electrode 58 and then a second electrode 62 is formed on the dielectric layer 62. The dielectric layer 61 employs an oxidized silicon nitride layer, tantalum oxide layer, aluminum oxide layer or hafnium oxide layer. The second electrode 62 can be formed by using a single layer of the doped polysilicon layer or by using a double layers of doped polysilicon/titanium nitride.

In the present invention, the MPS grain growth process is carried out at the temperature over 600° C. Thus, it is not suitable for employing an organic material, i.e., a photoresist layer, as the grain growth preventing layer, because the photoresist layer cannot endure the high temperature process over than 300° C. Additionally, there is a problem that the organic material such as the photoresist layer may contaminate a wafer.

In accordance with the present invention as mentioned already, the MPS grains are formed on the inner wall of the capacitor structure, thereby increasing the capacitance of the capacitor in a dynamic random access memory (DRAM) device having the feature size of 1.5 µm and below. Furthermore, it is possible to obtain an optimized cross section area of the capacitor owing to the prevention of the merging phenomenon, thereby improving the step coverage of the dielectric layer and reducing leakage current and breakdown voltage.

While the present invention has been described with respect to certain preferred embodiments only, other modifications and variation may be made without departing from the spirit and scope of the present invention as set forth in the following claims.

What is claimed is:

1. A capacitor in a semiconductor device, comprising:
   a semiconductor substrate provided with conductive regions;
   an interlayer dielectric layer formed on the semiconductor substrate;
   a contact plug formed through the interlayer dielectric layer and connected to the conductive regions;
   an etch barrier layer formed on the interlayer dielectric layer;
   a first electrode formed on the contact plug and portions of the interlayer dielectric layer;
   first meta-stable polysilicon (MPS) grains formed along a predetermined portion of inside walls of the first electrode without covering an inner bottom surface of the first electrode;
   second MPS grains formed along the inside walls of the first electrode except the predetermined portion of the inside walls, an average size of the second MPS grains being smaller than that of the first MPS grains;
   a dielectric layer formed on the first electrode, the first MPS grains, and the second MPS grains; and
   a second electrode formed on the dielectric layer.

2. The capacitor as recited in claim 1, wherein the first electrode has a profile where a width of a top region is wider than that of a bottom region.

3. The capacitor as recited in claim 1, wherein the first electrode comprises a double layer structure including an inner wall of an undoped silicon layer and an outer wall of a doped silicon layer.

* * * * *